United States Patent [19]

Berniere

[11] 4,206,427

[45] Jun. 3, 1980

[54] ELECTROMECHANICAL FILTERS

[75] Inventor: Michel G. Berniere, Louveciennes, France

[73] Assignee: Societe Anonyme de Telecommunications, France

[21] Appl. No.: 897,106

[22] Filed: Apr. 17, 1978

[30] Foreign Application Priority Data

Apr. 26, 1977 [FR] France ................... 77 12508

[51] Int. Cl.² .................... H03H 9/02; H03H 9/26
[52] U.S. Cl. ........................ 333/197; 333/198
[58] Field of Search ............. 333/71, 72, 197, 198; 29/594, 25.35

[56] References Cited

U.S. PATENT DOCUMENTS 3,028,564  4/1962  Tanaka et al. ................ 333/72

FOREIGN PATENT DOCUMENTS 7406913  9/1975  France ................... 333/71
2304217 10/1976  France ................... 333/71

*Primary Examiner*—Alfred E. Smith
*Assistant Examiner*—Marvin Nussbaum
*Attorney, Agent, or Firm*—Jacobs & Jacobs

[57] ABSTRACT

An electromechanical filter having two transducers and a mechanical filter vibrating in longitudinal mode, which includes a plurality of resonators connected to each other by coupling rods. The resonators are arranged in two sections and staggered, and the coupling rods connecting two resonators are welded on flat portions provided at the ends of the resonators, each end resonator is connected to the respective transducer through a coupling rod secured to the end face of said resonator adjacent the flat portion, at a point located in the symmetry plane of the resonator, and the coupling rod which connects the end resonator to the next resonator is secured on the flat portion so that the middle of its welded length lies in said symmetry plane.

3 Claims, 7 Drawing Figures

ELECTROMECHANICAL FILTERS

The present invention relates to band-pass electromechanical filters vibrating in longitudinal mode, and more particularly to those with a folded pattern.

Electromechanical filters comprise a mechanical filter disposed between two electromechanical transducers, and which is made of a plurality of cylindrical resonators connected to each other by coupling rods. In the filters of this type with a folded pattern, disclosed e.g. in U.S. Pat. No. 3,028,564, the resonators are arranged in two sections, each resonator of one section being coupled to both adjacent resonators of the other section, except the end resonators which are coupled to a single resonator and to a transducer.

Insofar as the connection mode between each resonator and the two coupling rods associated therewith is concerned, the French Patent Application No. 2,304,217 discloses to provide a flat portion at the end of the resonator and to weld the coupling rods on such a flat portion.

Nevertheless, the known filters, in which all the connections between resonators and coupling rods are made in this manner exhibit unsatisfactory filtering properties, namely, an attenuation vs. frequency characteristic which presents marked stray lines outside the bandwidth.

The object of the present invention is therefore to provide an electromechanical filter which presents an attenuation vs. frequency characteristic substantially free from stray lines.

This object can be attained with a special arrangement of the coupling rods associated with the end resonators. More precisely, each end resonator is connected to the respective transducer through a coupling rod secured to the end face of said resonator adjacent the flat portion, at a point located in the symmetry plane of the resonator, and the coupling rod which connects the end resonator to the next resonator is secured on the flat portion so that the middle of its welded length lies in said symmetry plane.

In a preferred embodiment, the coupling rod which connects the end resonator to the respective transducer is secured at the center of gravity of said end face.

The invention will be better understood from the following description made, in conjunction with the accompanying drawings, in which.

Figure 1:
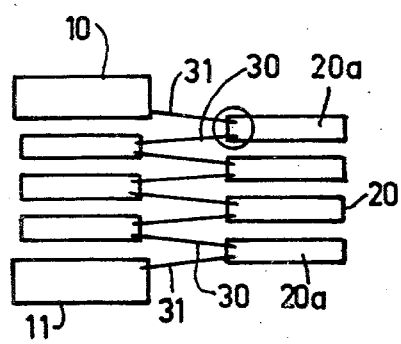
FIG. 1 is a plan view of a folded pattern filter of the prior art.
Figure 2:
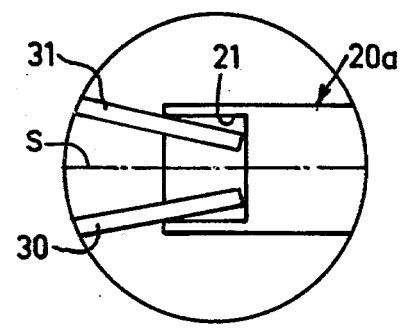
FIG. 2 shows at a large scale the encircled part in FIG. 1.

FIGS. 1 and 2 show an electromechanical filter of the prior art. This filter includes input and output electromechanical transducers 10 and 11, the terminals of which are not shown, and a mechanical filter connected between transducers 10 and 11 and comprising a number of cylindrical resonators 20 connected to each other through coupling rods 30 also of circular cross-section. However, the coupling rods which connect the transducers 10 and 11 respectively to the end resonators 20a are labelled with the reference numeral 31. The resonators 20 are arranged in two rows or sections and staggered, giving to the filter a so-called folded pattern.

The connection mode between the resonators and the associated coupling rods is identical for all the resonators and shown in detailed manner in FIG. 2 which relates to one of the end resonators 20a.

The resonator 20a is provided at its end with a flat 21 on which the coupling rods 30 and 31 are welded. The provision of such a flat allows a welding technique without filler material, such as resistance welding to be used, for securing the coupling rods and thus simplifies the carrying out of this attachment.

It should be noted, as to the coupling rods 30, that they may be inclined as shown in FIG. 1, but they may also be arranged in parallel relationship to the resonators.

The prior art filter shown in FIG. 1 and 2 possesses, however, insatisfactory filtering properties.

Figure 3:
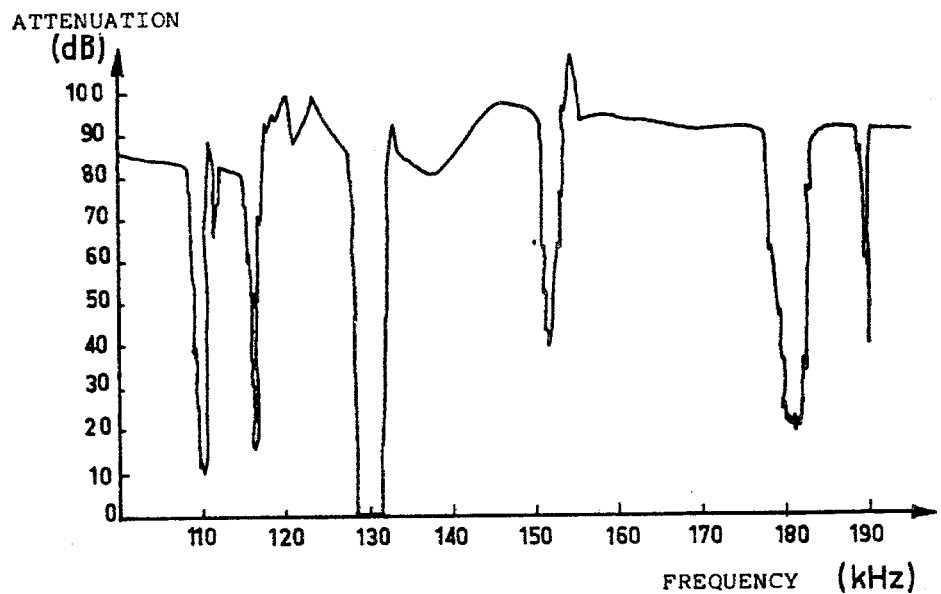
FIG. 3 shows the attenuation vs. frequency characteristic of the filter of FIG. 1.

The curve of FIG. 3, in which the attenuation is plotted vs. the frequency, exhibits strongly marked stray lines. With a bandwidth of 128-132 kHz in the embodiment of FIG. 3, marked stray lines can be observed at 105, 115 and 180 kHz. Such filters are utilized in the field of telephony, and those stray lines create undesirable disturbances.

The arrangement described below and shown in FIGS. 4-6 allows such stray lines to be substantially suppressed. It consists in welding on the flat 21 only the coupling rod 30 which connects the end resonator 20a to the adjacent resonator of the other row, with the coupling rod 30 being positioned in a determined way, and soldering the coupling rod 31 to the end face 22 of the resonator 20a adjacent the flat 21, also in a determined way.

More precisely, the coupling rods are secured in the following manner:

The coupling rod 30 is disposed so that the middle M of its welded length L lies in the symmetry plane S of the flat 21, hence of the resonator 20a.

As shown, the coupling rod 30 is inclined with respect to the axis of the resonator, this arrangement being preferred for compactness purposes. It could, however, be arranged in parallel relationship to the axis of the resonator.

Figure 4:
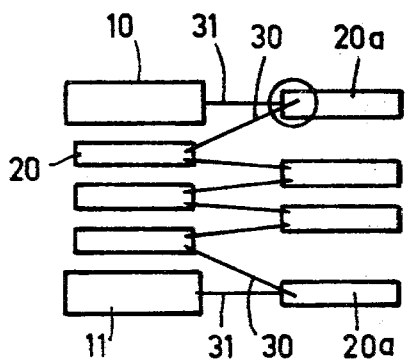
FIG. 4 is a plan view of a preferred embodiment of the filter in accordance with the invention.

Likewise, the other coupling rods connecting two resonators and shown in FIG. 4 may be arranged in parallel relationship to the resonators, as in the prior art described in reference to FIG. 1.

The coupling rod 31 is secured at a point of the face 22 lying in the symmetry plane S of the resonator 20a. The preferred mode of securing the coupling rod 31 is that shown in FIG. 6, and it consists in securing the coupling rod 31 at the center of gravity of the end face 22.

Figure 7:
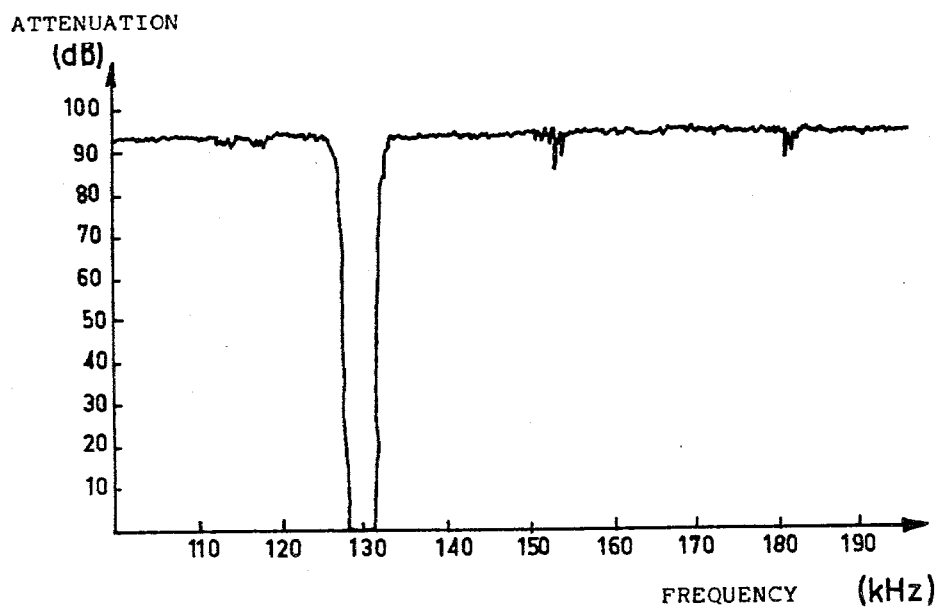
FIG. 7 shows the attenuation vs. frequency characteristic of the filter according to the invention.

The corresponding attenuation characteristic is shown in FIG. 7, and it may be seen that the stray lines have disappeared almost completely.

The reasons for such a marked improvement are not clearly elucidated, no assumption being quite satisfactory.

The coupling rod 31 is secured by forming a hole in the face 22 and tin-brazing the end of the coupling rod therein. Other techniques could be also contemplated, for example butt flash welding.

Figure 5:
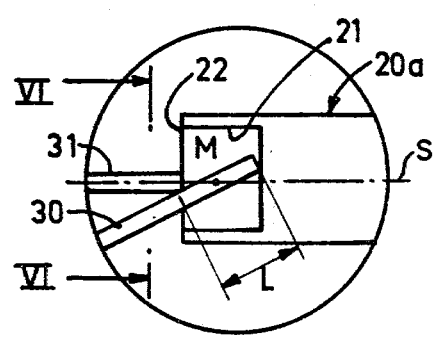
FIG. 5 shows at a larger scale the encircled part in FIG. 1.
Figure 6:
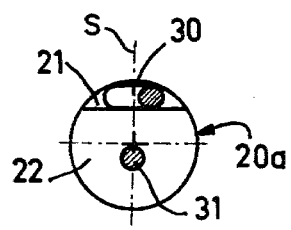
FIG. 6 is a sectional view along line VI—VI of FIG. 5.

The coupling rod 31 is shown in FIGS. 4 and 5 as being parallel to the axis of the resonator 20a, but this is not critical and a slight incline is possible according to need.

As to the coupling rod 30, it is secured by resistance welding or any other welding technique without filler material.

What I claim is:

1. In an electromechanical filter comprising a mechanical filter vibrating in longitudinal mode, connected between two electromechanical transducers, said mechanical filter including a plurality of cylindrical resonators connected to each other by coupling rods, said resonators being arranged in two sections, each resonator of a section being coupled to both adjacent resonators of the other section, the end resonators being coupled to a single resonator and to a transducer, the coupling rods connecting two resonators being welded on flat portions provided at the end of the resonators, the improvement in that each end resonator is connected to the respective transducer through a coupling rod secured to the end face of said resonator adjacent the flat portion, at a point located in the symmetry plane of the flat portion and hence of the resonator, and the coupling rod which connects the end resonator to the next resonator is secured on the flat portion so that the middle of its welded length lies in said symmetry plane.

2. In an electromechanical filter according to claim 1, in which the coupling rod which connects the end resonator to the respective transducer is secured at the center of gravity of said end face.

3. In an electromechanical filter according to any one of claims 1 and 2, in which the coupling rod connecting the end resonator to the next resonator is secured obliquely on the flat portion.

* * * * *